(12) United States Patent
Hirakawa et al.

(10) Patent No.: US 10,971,844 B2
(45) Date of Patent: Apr. 6, 2021

(54) CONNECTOR INCLUDING CONDUCTIVE VOLTAGE DETECTION TERMINAL BRANCHING FROM CONDUCTION PATH

(71) Applicant: Yazaki Corporation, Tokyo (JP)

(72) Inventors: Takayoshi Hirakawa, Shizuoka (JP); Yasuhiro Tanaka, Shizuoka (JP); Hiroki Kitagawa, Shizuoka (JP); Masanobu Higashitani, Shizuoka (JP); Kengo Machida, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 16/718,151

(22) Filed: Dec. 17, 2019

(65) Prior Publication Data

US 2020/0212613 A1     Jul. 2, 2020

(30) Foreign Application Priority Data

Dec. 28, 2018   (JP) .............................. JP2018-246785

(51) Int. Cl.
*H01R 13/22*     (2006.01)
*H01R 4/18*     (2006.01)
(Continued)

(52) U.S. Cl.
CPC ............. *H01R 13/22* (2013.01); *H01R 4/184* (2013.01); *H01R 13/502* (2013.01);
(Continued)

(58) Field of Classification Search
CPC .. H01R 13/22; H01R 13/502; H01R 13/5208; H01R 13/184; H01R 13/5213;
(Continued)

(56) References Cited

U.S. PATENT DOCUMENTS 8,021,201 B2 *   9/2011   Lang ....................... G01R 31/34
                                                                            439/884
2001/0023147 A1 *   9/2001   Kashiyama .......... H01R 13/422
                                                                            439/488

(Continued)

FOREIGN PATENT DOCUMENTS

WO       2014/069285 A1     5/2014

*Primary Examiner* — Renee S Luebke
*Assistant Examiner* — Paul D Baillargeon
(74) *Attorney, Agent, or Firm* — Kenealy Vaidya LLP

(57) ABSTRACT

A connector includes: a casing that has a housing space, a through hole communicating the housing space with an external space, and an electric wire insertion hole, and that holds a connection terminal connected to a counterpart device; a wiring material that has a distal end part inserted into the housing space via the electric wire insertion hole and a conductor part exposed from a covering at the distal end part, the exposed conductor part being curved at a curved part and connected to the connection terminal; and a conductive voltage detection terminal that has a connection part connected to the exposed conductor part at a position closer to the covering than a curved part and a voltage detection part facing the through hole, and that is provided by branching from a conduction path between the connection terminal and the conductor part.

12 Claims, 10 Drawing Sheets

(51) Int. Cl.
   *H01R 13/502* (2006.01)
   *H01R 13/52* (2006.01)
   *H01R 13/6592* (2011.01)

(52) U.S. Cl.
   CPC ..... *H01R 13/5208* (2013.01); *H01R 13/6592* (2013.01); *H01R 2201/20* (2013.01)

(58) Field of Classification Search
   CPC ............ H01R 13/6592; H01B 2201/20; G01R 1/0408; G01R 31/2808; G01R 31/2818; G01R 31/55; G01R 31/66
   USPC .......................... 439/218, 222; 324/537, 538
   See application file for complete search history.

(56) References Cited

U.S. PATENT DOCUMENTS

| | | |
|---|---|---|
| 2014/0120763 A1 | 5/2014 | Itsuki et al. |
| 2015/0229067 A1 | 8/2015 | Nakai et al. |
| 2017/0256893 A1 | 9/2017 | Kato et al. |
| 2018/0175537 A1 | 6/2018 | Kashiwada |
| 2019/0157780 A1* | 5/2019 | Lueckemeier ....... H01R 12/515 |

* cited by examiner

CONNECTOR INCLUDING CONDUCTIVE VOLTAGE DETECTION TERMINAL BRANCHING FROM CONDUCTION PATH

CROSS-REFERENCE TO RELATED APPLICATION(S)

The present application claims priority to and incorporates by reference the entire contents of Japanese Patent Application No. 2018-246785 filed in Japan on Dec. 28, 2018.

BACKGROUND OF THE INVENTION

1. Field of the Invention

The present invention relates to a connector.

2. Description of the Related Art

In a connector in which a terminal connected to a counterpart terminal and an end part of an electric wire connected to the terminal are housed in a casing, conduction confirmation and voltage measurement may be performed on a wiring material disposed in the casing via through holes formed in the casing. International Publication No. 2014-069285 discloses a technology for a connector in which a rear housing houses a terminal provided at an end of an electric wire, a front housing houses a counterpart terminal connected to the terminal, and the rear housing is provided with a confirmation window capable of confirming a voltage of the terminal and a waterproof lid that closes the confirmation window.

In accordance with the connector of International Publication No. 2014-069285, reliable waterproof performance is obtained and conduction confirmation and voltage measurement can be easily performed.

Meanwhile, in the connector, confirmation of a conductive state in the casing is performed via through holes formed in the casing. In such a case, in the connector, for example, there is a need for a configuration in which it is possible to easily perform the confirmation of the conductive state in the casing while ensuring more appropriate conduction characteristics of members between a connection terminal and a core wire of the electric wire.

SUMMARY OF THE INVENTION

An object of the present invention is to provide a connector capable of easily confirming a conductive state in a casing while ensuring appropriate conduction characteristics.

In order to achieve the above mentioned object, a connector according to one aspect of the present invention includes a casing that has a housing space, a through hole communicating the housing space with an external space, and an electric wire insertion hole, and that holds a connection terminal connected to a counterpart device; a wiring material that has a distal end part inserted into the housing space via the electric wire insertion hole and a conductor part exposed from a covering at the distal end part, the exposed conductor part being curved at a curved part and connected to the connection terminal; and a conductive voltage detection terminal that has a connection part connected to the exposed conductor part at a position closer to the covering than the curved part and a voltage detection part facing the through hole, and that is provided by branching from a conduction path between the connection terminal and the conductor part.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Hereinafter, connectors according to embodiments of the present invention will be described in detail with reference to the drawings. It is noted that the invention is not limited by the embodiments. Constituent elements in the following embodiments include those that can be easily arrived at by a person skilled in the art or those that are substantially the same.

First Embodiment

Figure 1:
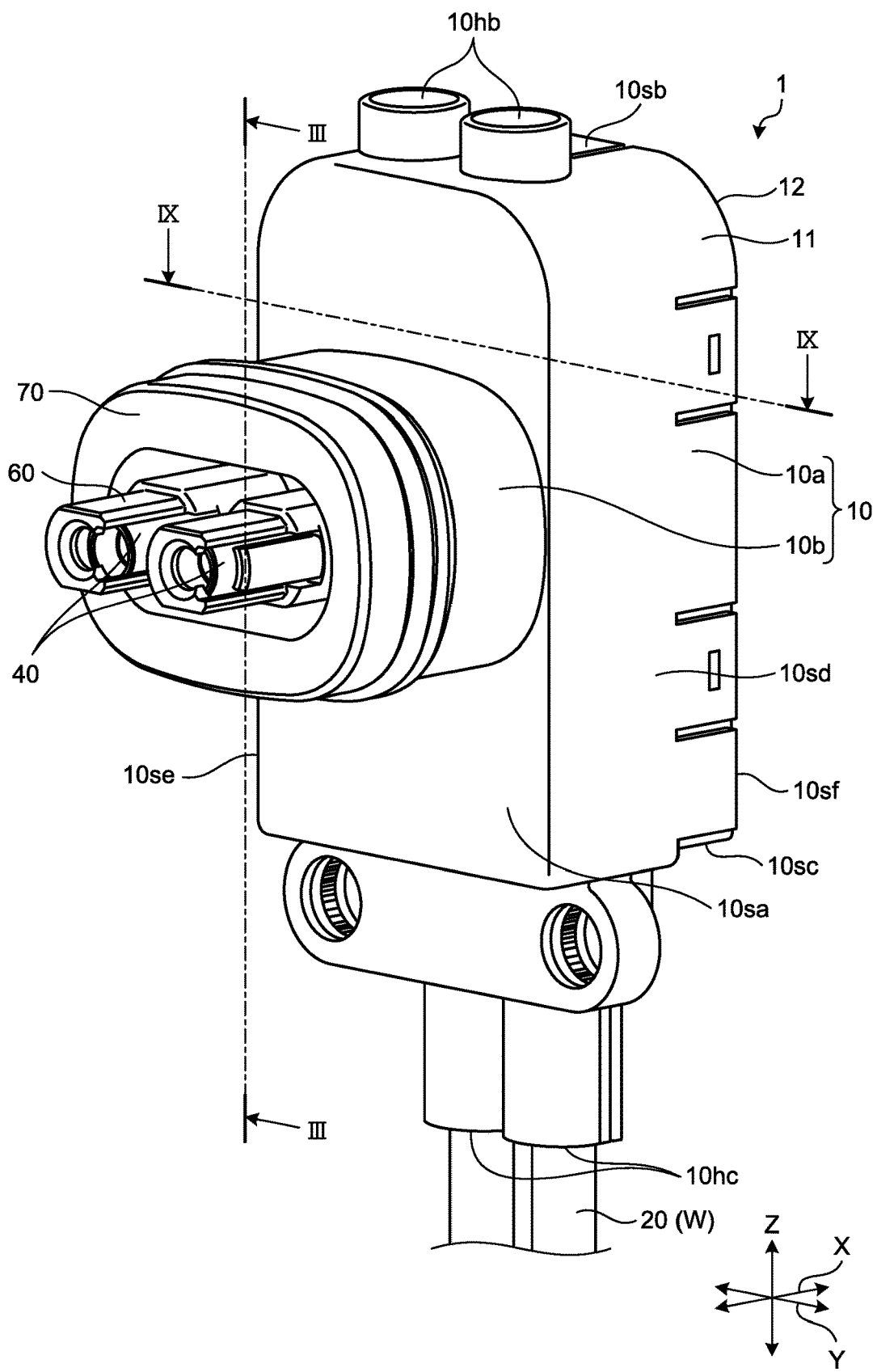
FIG. 1 is a perspective view illustrating a connector according to a first embodiment.
Figure 2:
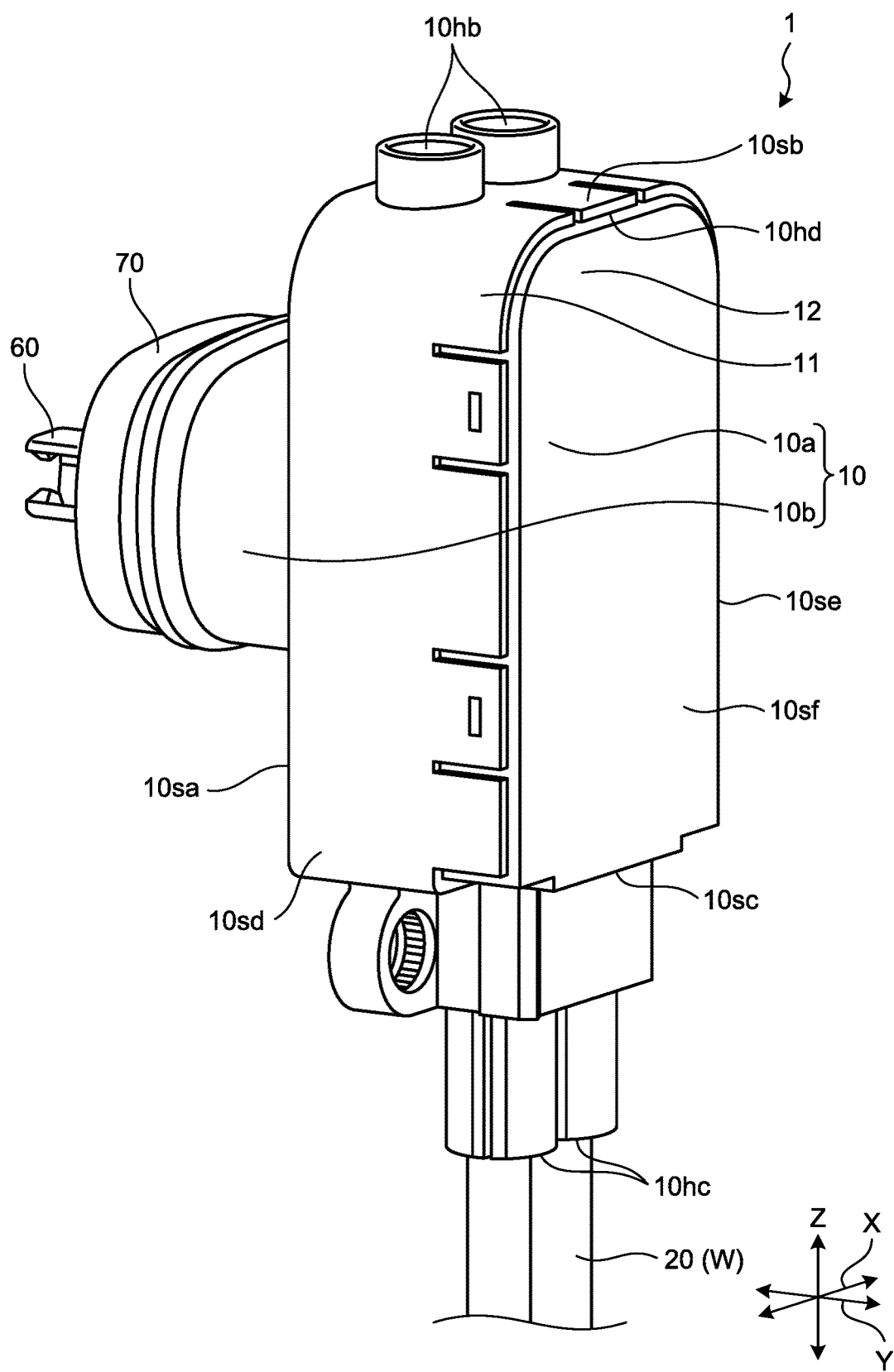
FIG. 2 is a perspective view illustrating the connector according to the first embodiment.
Figure 3:
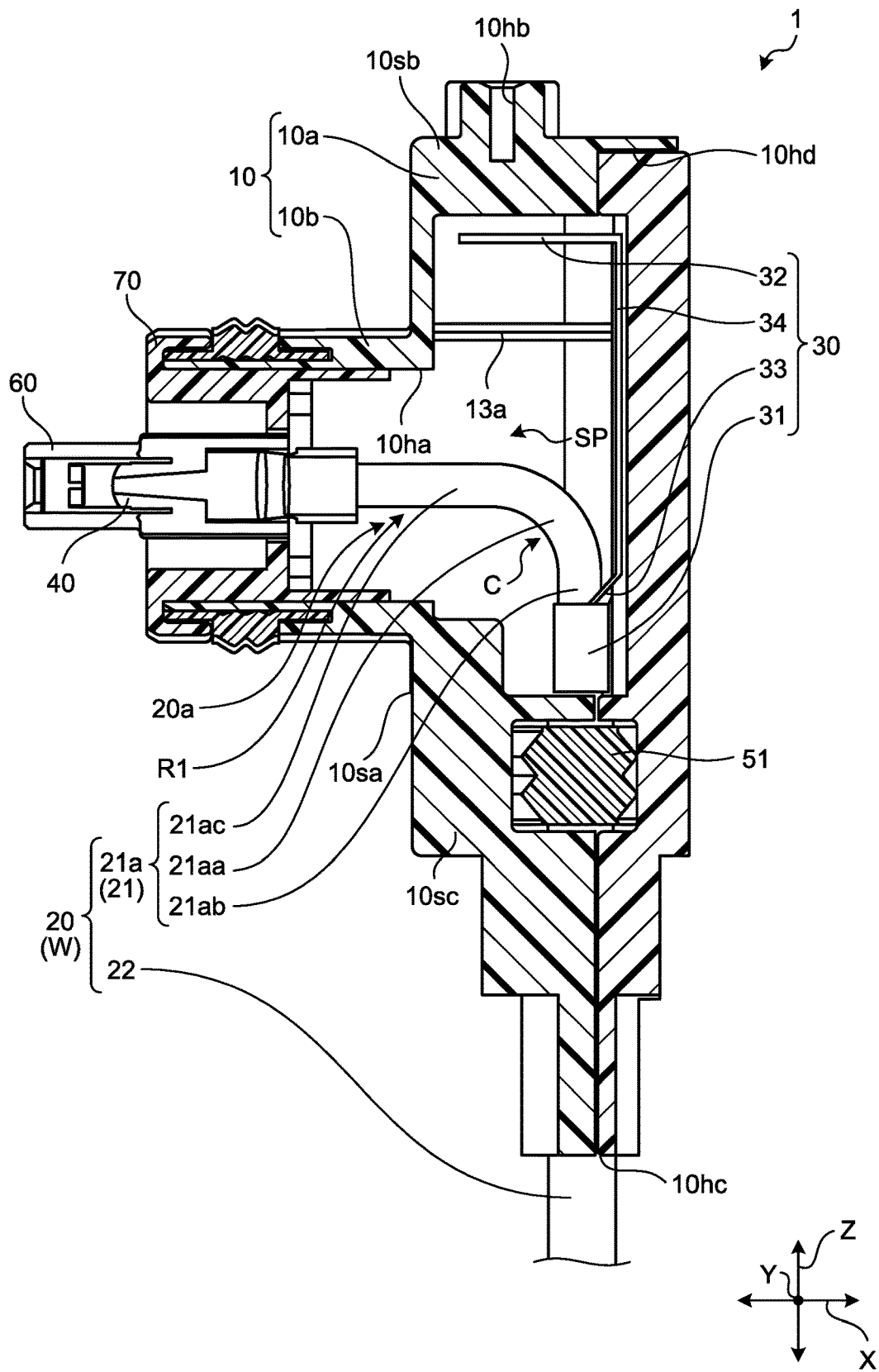
FIG. 3 is a sectional view illustrating the connector according to the first embodiment.
Figure 4:
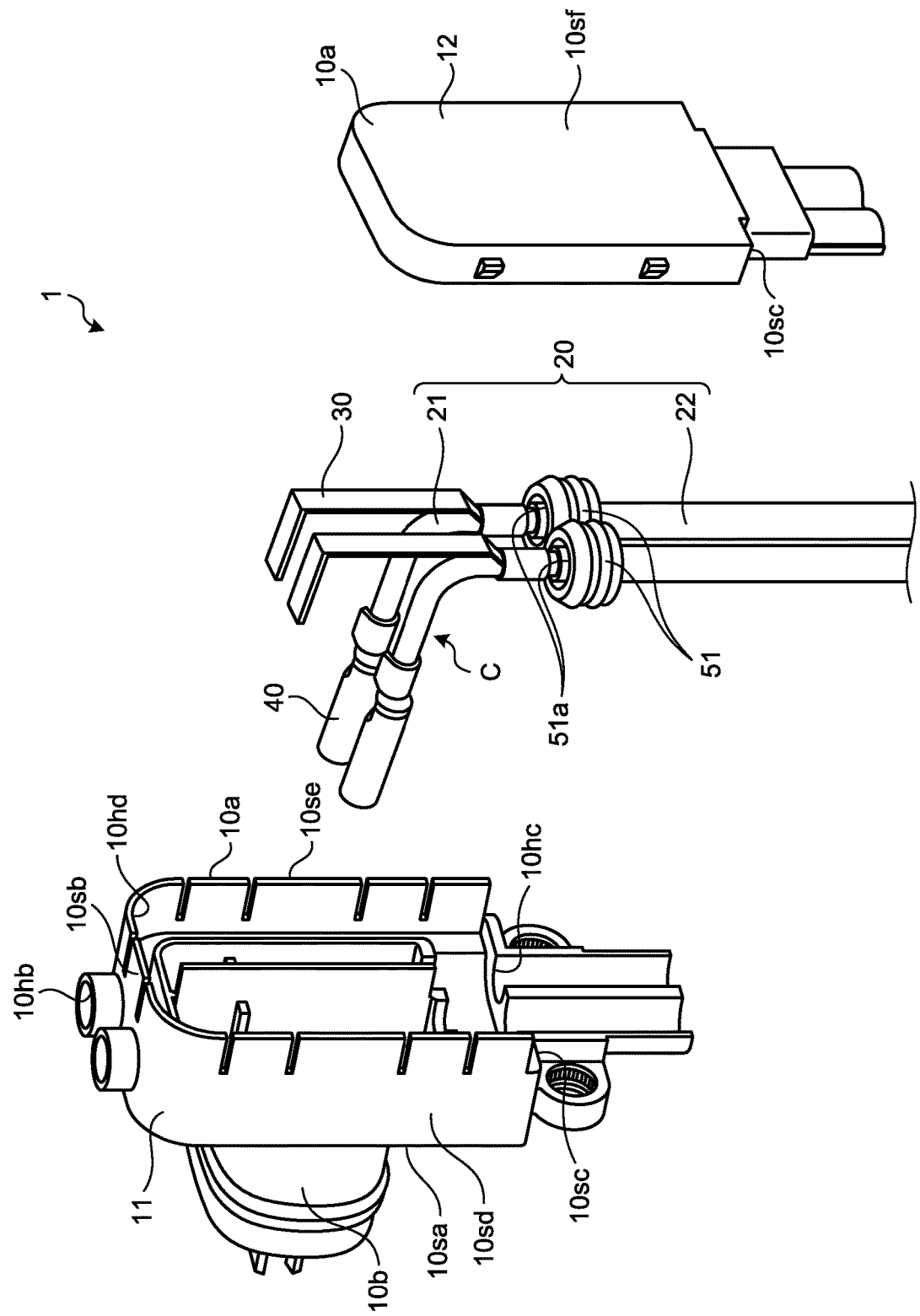
FIG. 4 is an exploded perspective view illustrating the connector according to the first embodiment.
Figure 5:
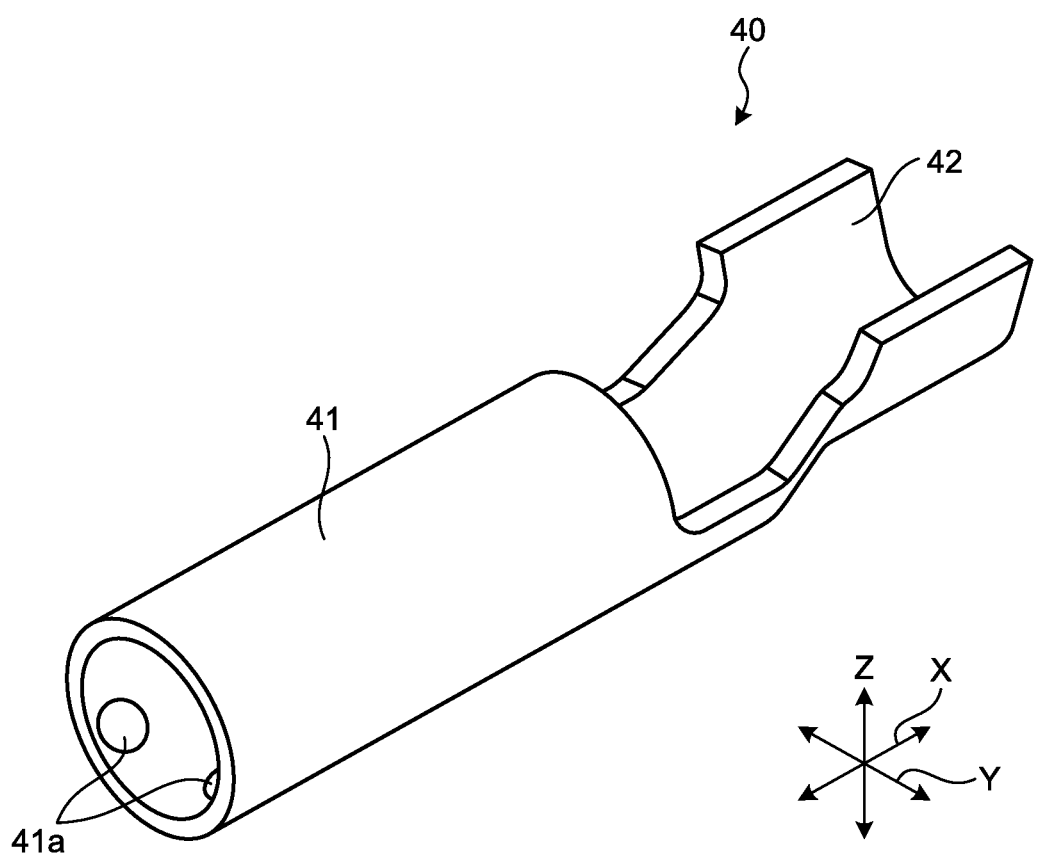
FIG. 5 is a perspective view illustrating a terminal according to the first embodiment.
Figure 6:
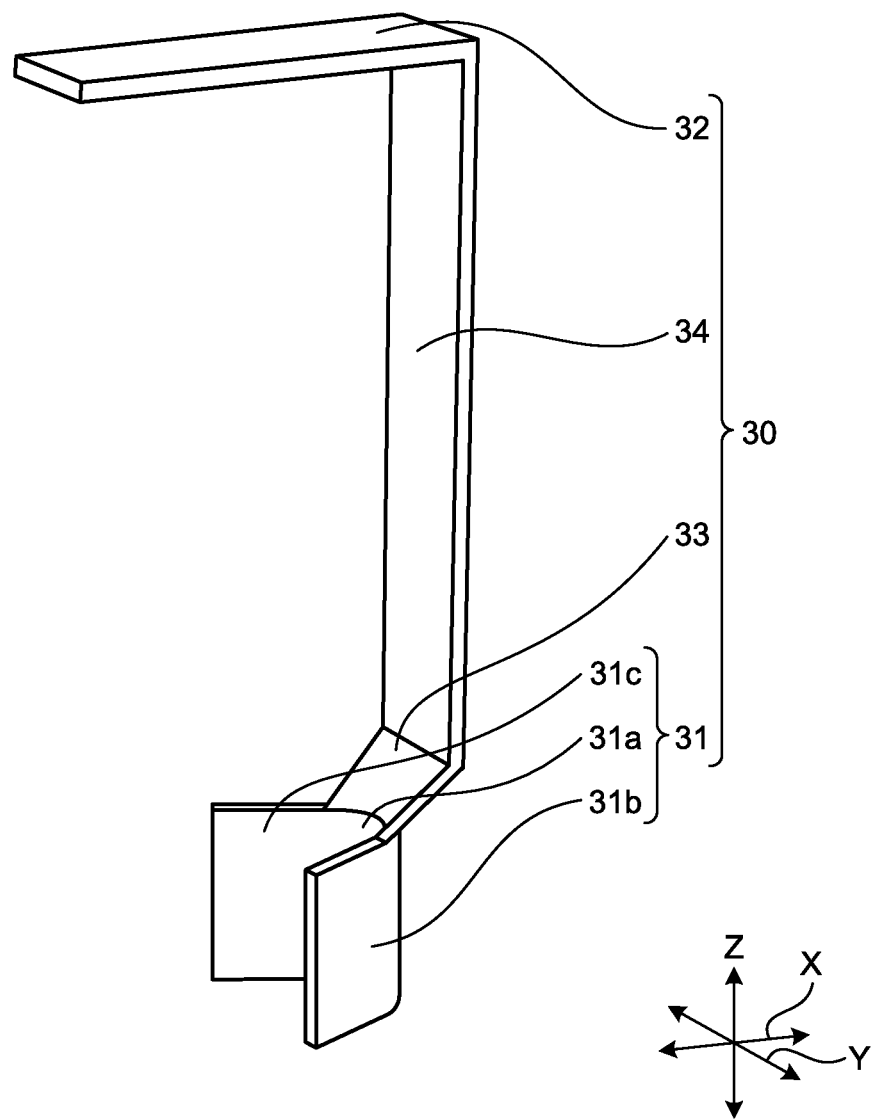
FIG. 6 is a perspective view illustrating a voltage detection terminal according to the first embodiment.
Figure 7:
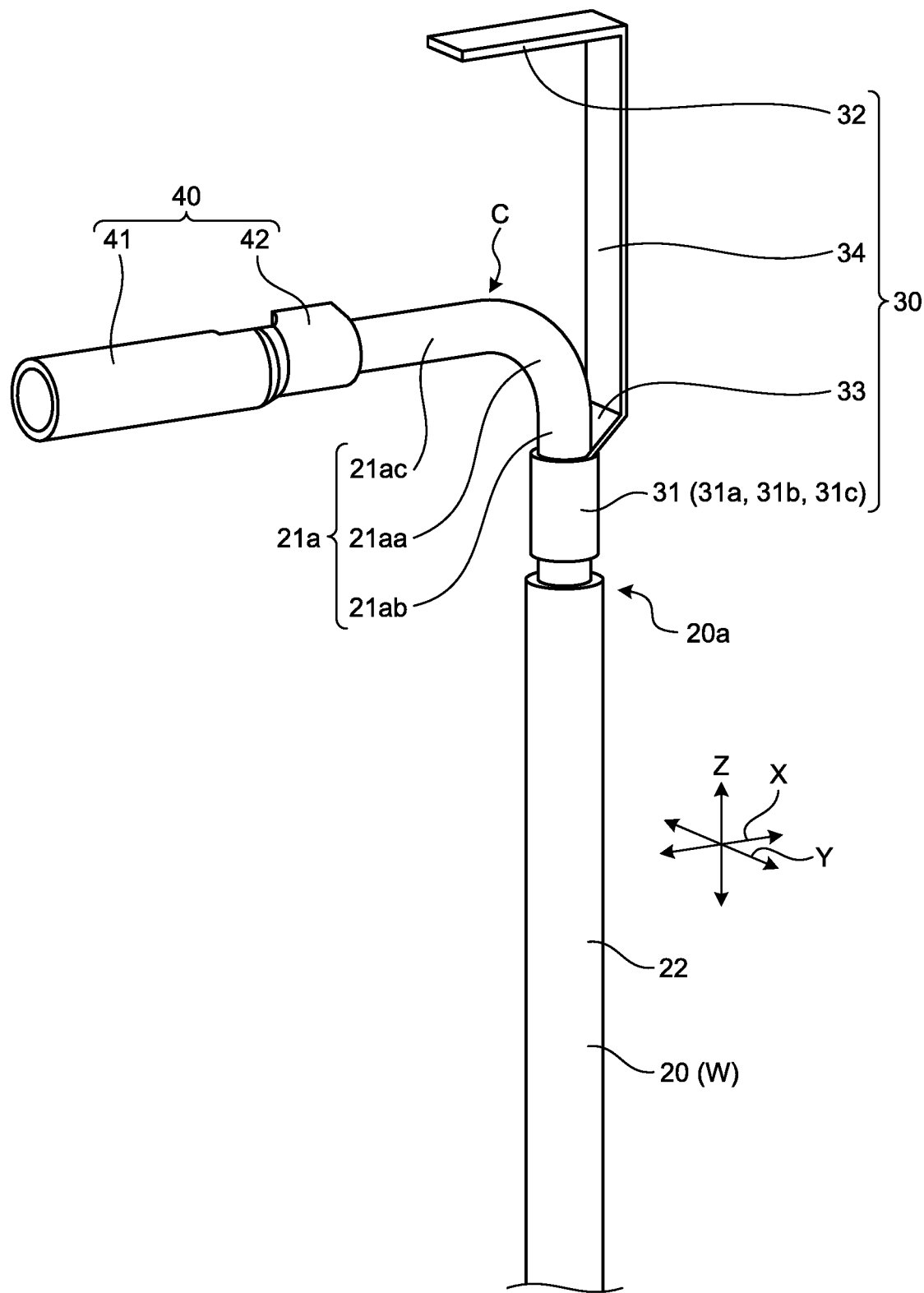
FIG. 7 is a perspective view illustrating the voltage detection terminal according to the first embodiment.
Figure 8:
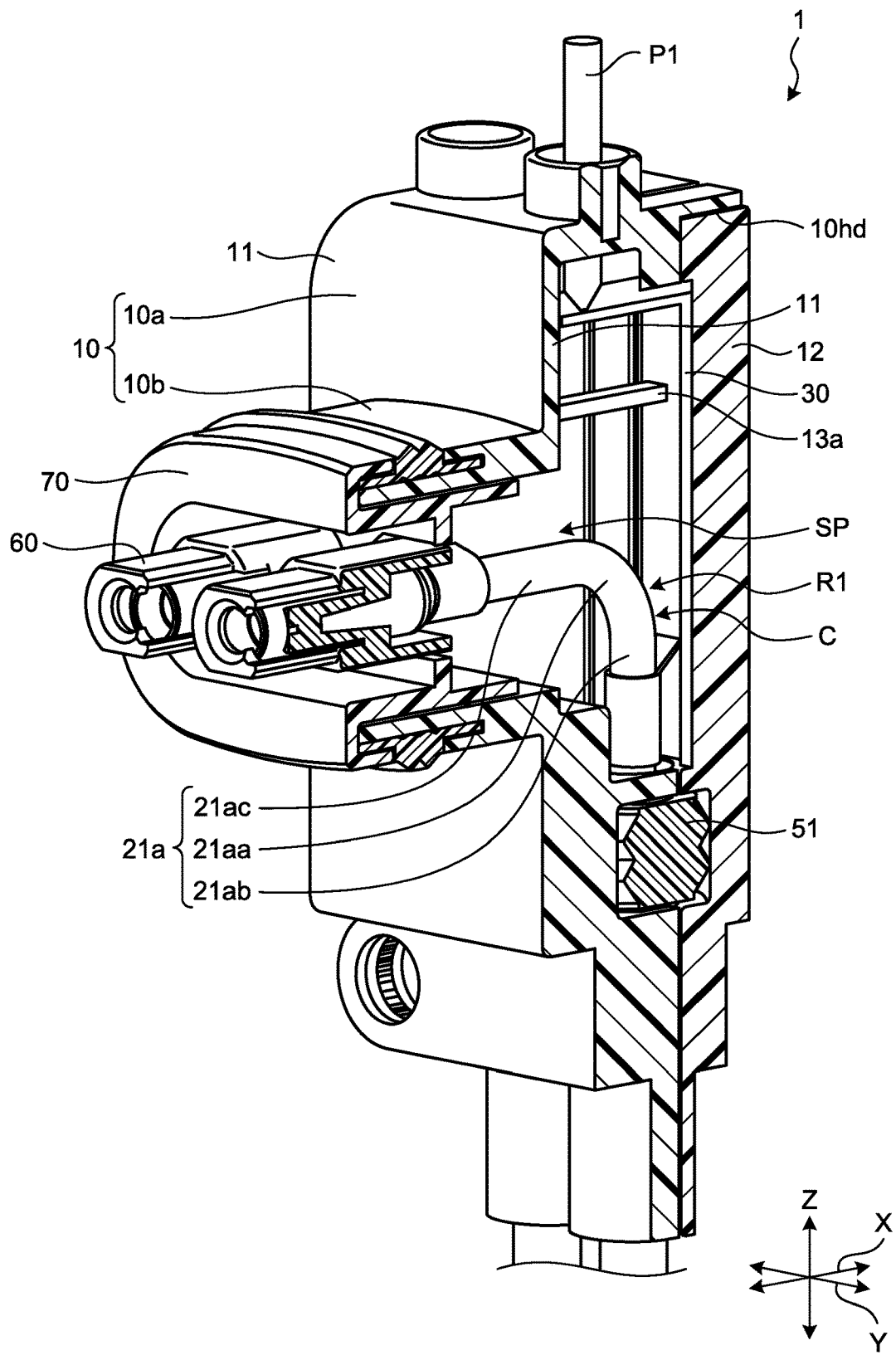
FIG. 8 is a perspective sectional view illustrating the connector according to the first embodiment.
Figure 9:
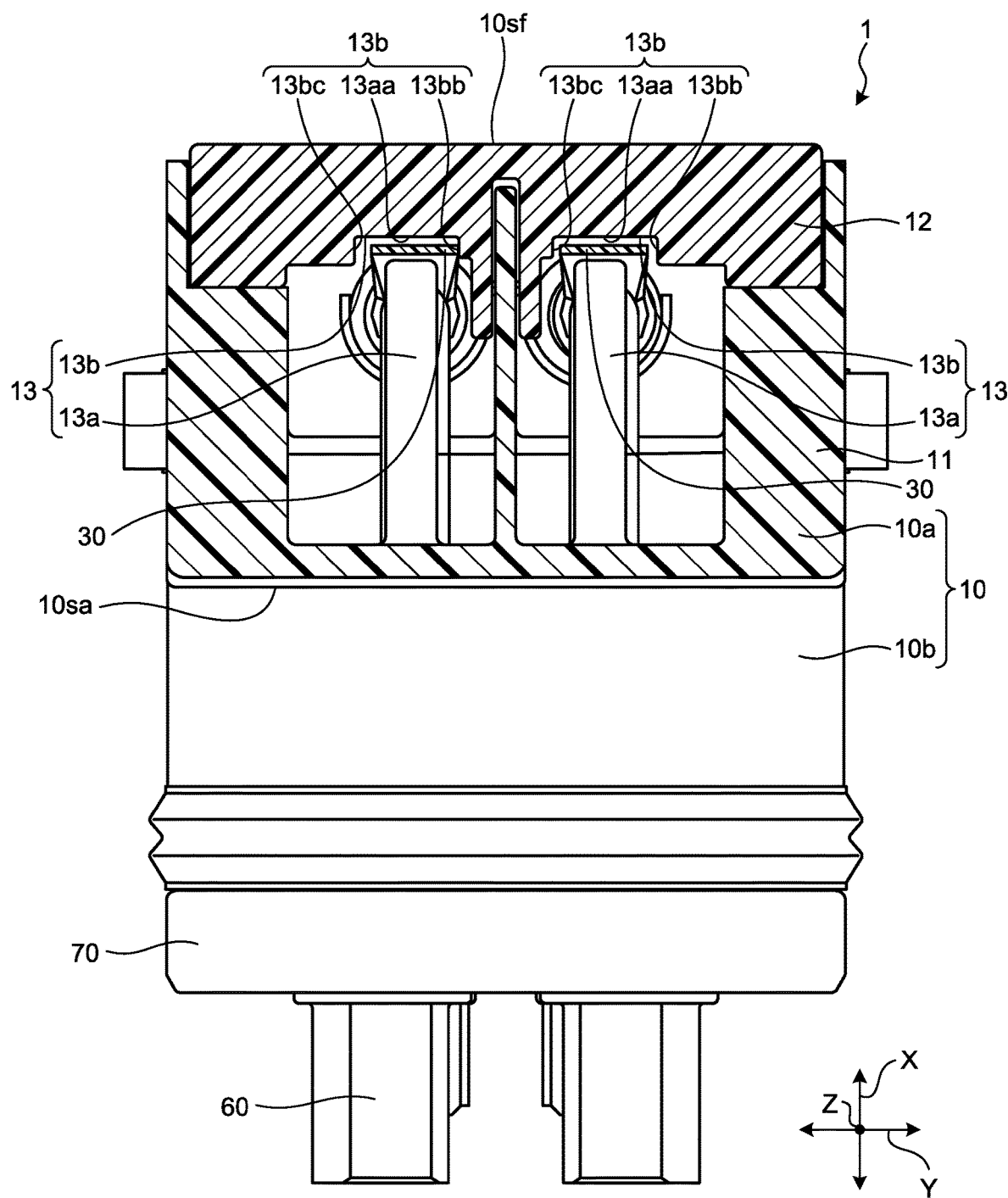
FIG. 9 is a sectional view illustrating the connector according to the first embodiment.

With reference to FIG. 1 to FIG. 9, an embodiment will be described. An embodiment relates to a connector. FIG. 1 is a perspective view illustrating a connector according to a first embodiment. FIG. 2 is a perspective view illustrating the connector according to the first embodiment. FIG. 3 is a sectional view illustrating the connector according to the first embodiment. FIG. 4 is an exploded perspective view illustrating the connector according to the first embodiment. FIG. 5 is a perspective view illustrating a terminal according to the first embodiment. FIG. 6 is a perspective view illustrating a voltage detection terminal according to the first embodiment. FIG. 7 is a perspective view illustrating the voltage detection terminal according to the first embodiment. FIG. 8 is a perspective sectional view illustrating the connector according to the first embodiment. FIG. 9 is a sectional view illustrating the connector according to the first embodiment. FIG. 3 is a section taken along line III-III illustrated in FIG. 1. Furthermore, FIG. 9 is a section taken along line IX-IX illustrated in FIG. 1. Furthermore, FIG. 8 is a perspective sectional view corresponding to the section illustrated in FIG. 3.

A connector 1 according to the present embodiment is physically and electrically connected to a connector (counterpart connector) of a counterpart device to be fitted. Hereinafter, in the specification, a direction in which the connector 1 is inserted into and removed from the counterpart connector is referred to as a "front and rear direction X", a direction perpendicular to the front and rear direction X is referred to as a "width direction Y", and a direction perpendicular to each of the front and rear direction X and the width direction Y is referred to as a "height direction Z". Furthermore, in relation to the connector 1, a side connected to the counterpart connector in the front and rear direction X is referred to as a "front side" and a side opposite to the front side is referred to as a "rear side".

As illustrated in FIG. 1 to FIG. 3, the connector 1 includes a casing 10, covered electric wires 20, a voltage detection terminal 30, and connection terminals 40.

The casing 10 is a box-shaped member that houses the connection terminals 40 and a terminal of the covered electric wires 20 therein. The casing 10 is formed of an insulating resin material. The casing 10 has an electric wire housing part 10a and a terminal housing part 10b. The electric wire housing part 10a is a part that houses a distal end part 20a of the covered electric wire 20, and the terminal housing part 10b is a part that houses the connection terminals 40 and is fitted to the counterpart connector.

As illustrated in FIG. 1 and FIG. 2, the electric wire housing part 10a of the embodiment is formed in a rectangular parallelepiped box shape with the height direction Z as a longitudinal direction. The length of the electric wire housing part 10a in the front and rear direction X is formed to be smaller than that of the electric wire housing part 10a in the width direction Y. As illustrated in FIG. 3, a first opening 10ha is formed in a wall part 10sa on the front side of the electric wire housing part 10a in the front and rear direction X. The first opening 10ha of the embodiment is formed in a circular shape in the central vicinity of the wall part 10sa.

As illustrated in FIG. 1, the terminal housing part 10b is formed in a cylindrical shape. The terminal housing part 10b protrudes toward the front side in the front and rear direction X from the wall part 10sa of the electric wire housing part 10a so as to surround the first opening 10ha of the electric wire housing part 10a. A space surrounded by the electric wire housing part 10a and a space surrounded by the terminal housing part 10b communicate with each other via the first opening 10ha. In the casing 10, the space surrounded by the electric wire housing part 10a and the space surrounded by the terminal housing part 10b constitute a housing space SP of the casing 10. The housing space SP is a space that houses the distal end part 20a of the covered electric wire 20, the voltage detection terminal 30, the connection terminals 40, and the like.

The casing 10 has through holes 10hb and electric wire insertion holes 10hc. In the embodiment, the through holes 10hb and the electric wire insertion holes 10hc are formed in the electric wire housing part 10a. The through holes 10hb connect the housing space SP with an external space. The through hole 10hb is a hole into which a voltage detection probe P1 to be described below is inserted. The through holes 10hb are formed in one wall part 10sb of two wall parts 10sb and 10sc of the electric wire housing part 10a, which face each other in the height direction Z. The electric wire insertion hole 10hc is a hole into which the distal end part 20a of the covered electric wire 20 to be described below is inserted. The electric wire insertion holes 10hc are formed in the other wall part 10sc of the two wall parts 10sb and 10sc of the electric wire housing part 10a. The through holes 10hb and the electric wire insertion holes 10hc are located at substantially the same positions in the width direction Y. Furthermore, in the front and rear direction X, the through holes 10hb are located in front of the electric wire insertion holes 10hc.

As illustrated in FIG. 4, the casing 10 of the embodiment has a division structure divided into two casing members (a first casing member 11 and a second casing member 12), and is formed in a box shape by assembling the first casing member 11 and the second casing member 12.

The first casing member 11 includes a part of the electric wire housing part 10a and the terminal housing part 10b, and the second casing member 12 includes the other part of the electric wire housing part 10a. Here, the first casing member 11 includes the wall part 10sa, the wall part 10sb, a front portion of the wall part 10sc, and a pair of wall parts 10sd and 10se facing each other in the width direction Y, which constitute the electric wire housing part 10a. The rear side of the first casing member 11 is an opening (second opening 10hd) and the first casing member 11 is formed in a cylindrical shape with the front and rear direction X as an axial direction. The aforementioned through holes 10hb are provided in the first casing member 11.

The second casing member 12 includes a rear portion of the wall part 10sc and a wall part 10sf facing the wall part 10sa, which constitute the electric wire housing part 10a. The second casing member 12 is a lid-shaped member that closes the second opening 10hd of the first casing member 11. The second casing member 12 is assembled to the first casing member 11 so as to close the second opening 10hd from the rear side with respect to the first casing member 11, thereby constituting the casing 10 together with the first casing member 11. As a consequence, a space surrounded by the first casing member 11 and the second casing member 12 serves as the housing space SP. In such a case, the aforementioned electric wire insertion holes 10hc are formed between a part of the front portion of the wall part 10sc and a part of the rear portion of the wall part 10sc.

The connector 1 of the present embodiment further includes waterproof packings 51. In a state in which the waterproof packings 51 have been attached to the covered electric wire 20, the waterproof packings 51 is interposed in a gap between the first casing member 11 and the second casing member 12, thereby suppressing liquid such as water from entering the housing space SP from the external space. The waterproof packing 51 is formed with an insertion hole 51a. The waterproof packing 51 is formed in a cylindrical shape surrounding the insertion hole 51a. The shape and the size of the insertion hole 51a in the waterproof packing 51 are set to correspond to those of the covered electric wire 20. The covered electric wire 20 is attached to the waterproof packing 51 by being inserted into the insertion hole 51a. The waterproof packing 51 is disposed on the wall part 10sc in the second opening 10hd inside the first casing member 11. Here, the waterproof packing 51 is disposed such that the insertion hole 51a and the electric wire insertion hole 10hc communicate with each other. The waterproof packing 51 suppresses liquid from entering the housing space SP from a gap between the covered electric wire 20 and the electric wire insertion hole 10hc and a gap between the first casing member 11 and the second casing member 12 in the wall part 10sc. In the covered electric wire 20 has been inserted into the insertion hole 51a, the covered electric wire 20 is disposed between the first casing member 11 and the second casing member 12 together with the waterproof packing 51 (see FIG. 4). Then, by assembling the first casing member 11 and the second casing member 12, the covered electric wire 20 is inserted into the electric wire insertion hole 10*hc* and disposed in the housing space SP. As a consequence of the assembling, between the first casing member 11 and the second casing member 12, the waterproof packing 51 suppresses liquid such as water from entering the housing space SP from the external space. In the embodiment, two electric wire insertion holes 10*hc* are formed in the wall part 10*sc*, and the covered electric wires 20 are inserted into the two electric wire insertion holes 10*hc*, respectively. One waterproof packing 51 is attached to each of the covered electric wire 20.

In the embodiment, the covered electric wire 20 constitutes a wiring material W of the connector 1. The covered electric wire 20 includes a core wire 21 and a covering 22. The core wire 21 constitutes a conductor part C in the wiring material W. As illustrated in FIG. 3, the distal end part 20*a* of the covered electric wire 20 is inserted into the housing space SP via the electric wire insertion hole 10*hc*. At the distal end part 20*a* of the covered electric wire 20, an end of the core wire 21 is exposed from the covering 22. A part (curved part 21*aa*) of the end (core wire exposed part 21*a*) of the core wire 21, which is exposed from the covering 22, is curved and connected to the connection terminal 40 housed in the terminal housing part 10*b*. A portion 21*ab* of the core wire exposed part 21*a*, which is closer to the covering 22 than the curved part 21*aa*, extends along the height direction Z, and a portion 21*ac* of the core wire exposed part 21*a*, which is closer to the connection terminal 40 than the curved part 21*aa*, extends along the front and rear direction X.

Before describing the voltage detection terminal 30, the connection terminal 40 will be described first.

The connection terminal 40 is housed in the terminal housing part 10*b* of the casing 10. When the terminal housing part 10*b* is fitted to a counterpart connector, the connection terminal 40 is electrically connected to a terminal of the counterpart connector. As illustrated in FIG. 5, the connection terminal 40 of the present embodiment is a female connection terminal. The connection terminal 40 has a terminal connection part 41 and a crimping part 42.

The terminal connection part 41 is a part connected to the terminal of the counterpart connector. The terminal connection part 41 is formed in a cylindrical shape. The terminal connection part 41 has the indentation 41*a* formed thereon, the indentation 41*a* serving as a contact point with the terminal of the counterpart connector. The crimping part 42 is a part that is electrically connected to the core wire exposed part 21*a*. The crimping part 42 extends from a rear end part of the connection terminal 40 in the front and rear direction X. When the connection terminal 40 before being connected to the core wire exposed part 21*a* is viewed from the front and rear direction X, the crimping part 42 is formed in a U shape. The core wire exposed part 21*a* is disposed inside the U-shaped part of the crimping part 42, is caulked together with the crimping part 42, and thus is connected to the connection terminal 40 (see FIG. 7).

The connector 1 of the present embodiment further includes an inner housing 60 and a front holder 70. The connection terminals 40 are supported in the housing space SP inside the terminal housing part 10*b* in a state of being housed in the inner housing 60. Furthermore, the connection terminals 40 are held in the housing space SP together with the inner housing 60 by the front holder 70 attached to a rear end portion of the terminal housing part 10*b* in the front and rear direction X. With such a configuration, the position of the connection terminal 40 in the housing space SP is restricted.

The voltage detection terminal 30 is a conductive terminal member for confirming a conductive state between the covered electric wire 20 and the connection terminal 40 in the housing space SP of the casing 10. As illustrated in FIG. 6, the voltage detection terminal 30 has a connection part 31, a voltage detection part 32, a bending part 33, and an extension part 34. In the voltage detection terminal 30, the connection part 31, the bending part 33, the extension part 34, and the voltage detection part 32 are arranged in this order from one side to the other side along the height direction Z and are integrally formed with one another.

The connection part 31 is a part connected to the core wire 21 of the covered electric wire 20. As illustrated in FIG. 3, the connection part 31 is connected to the core wire exposed part 21*a* at a position closer to the covering 22 than the curved part 21*aa*. That is, the connection part 31 is connected to the portion 21*ab* of the core wire exposed part 21*a*. The connection part 31 of the present embodiment has an intermediate portion 31*a* and a pair of barrel piece portions 31*b* and 31*c*. The barrel piece portion 31*b* protrudes from one end portion of the intermediate portion 31*a* in the width direction Y. Furthermore, the barrel piece portion 31*c* protrudes from the other end portion of the intermediate portion 31*a* in the width direction Y. The intermediate portion 31*a* and the pair of barrel piece portions 31*b* and 31*c* are wound around and crimped to the portion 21*ab* of the core wire exposed part 21*a* (see FIG. 7). The connection part 31 is crimped to the portion 21*ab* of the core wire exposed part 21*a*, so that the voltage detection terminal 30 and the core wire 21 are electrically connected to each other.

The voltage detection part 32 is a part that comes into contact with the voltage detection probe P1 when a conductive state in the casing 10 is confirmed. The voltage detection part 32 is electrically connected to the core wire exposed part 21*a* via the extension part 34, the bending part 33, and the connection part 31. As illustrated in FIG. 8, the voltage detection part 32 is disposed at a position facing the through hole 10*hb*. The voltage detection part 32 of the embodiment is formed in a plate shape having two main surfaces. One of the two main surfaces of the voltage detection part 32 is disposed toward the through hole 10*hb*.

The bending part 33 is provided between the connection part 31 and the extension part 34. In the voltage detection terminal 30, the bending part 33 is a part that is bent in a direction away from the core wire 21. The bending part 33 extends along the height direction Z from an end portion of the connection part 31, which faces the through hole 10*hb*. The bending part 33 is inclined such that a portion farther from the connection part 31 is located on the rear side. In the present embodiment, the bending part 33 extends from the end portion of the intermediate portion 31*a*, which faces the through hole 10*hb* (see FIG. 6).

The extension part 34 is provided between the bending part 33 and the voltage detection part 32. The extension part 34 extends along an insertion direction (height direction Z) of the covered electric wire 20 from an end portion of the bending part 33 opposite to the connection part 31 side. The extension part 34 extends to a position closer to the first opening 10*ha* than the curved part 21*aa* in the height direction Z. The voltage detection part 32 extends toward the front side from an end portion of the extension part 34 opposite to the bending part 33 side. That is, a part including the voltage detection part 32 and the extension part 34 of the voltage detection terminal 30 is formed in an inverted L shape when viewed from the width direction Y. The voltage detection part 32 extends to a position in front of the through hole 10*hb* in the front and rear direction X.

The voltage detection terminal 30 configured as described above extends along the height direction Z corresponding to the insertion direction of the covered electric wire 20 (wiring material W) with respect to the casing 10 and is supported on the core wire 21 (conductor part C) in a cantilever manner in the state of being connected to the core wire 21 of the covered electric wire 20 via the connection part 31. Furthermore, the voltage detection terminal 30 is provided by branching from a conduction path between the connection terminal 40 and the core wire 21. The voltage detection terminal 30 of the present embodiment branches from the conduction path between the connection terminal 40 and the core wire 21 with a connection point between the core wire 21 and the connection part 31 as a branch point.

In the case of confirming the conductive state in the casing 10, a worker brings the voltage detection probe P1 into contact with the voltage detection part 32 via the through hole 10*hb*. The voltage detection probe P1 comes into contact with the voltage detection part 32, so that it is possible to confirm the conductive state in the casing 10. In the confirmation of the conductive state by the voltage detection probe P1, for example, a current value, a voltage value, and the like of power flowing between the connection terminal 40 and the core wire 21 are detected.

As illustrated in FIG. 9, the casing 10 further has a restriction wall part 13 that restricts the voltage detection terminal 30 from vibrating in a direction (for example, the front and rear direction X or the width direction Y) intersecting the insertion direction of the covered electric wire 20. The restriction wall part 13 of the present embodiment includes a first restriction wall part 13*a* and a second restriction wall part 13*b*.

The first restriction wall part 13*a* is a wall part that protrudes toward the extension part 34 from the wall part 10*sa* of the first casing member 11. In the height direction Z, the first restriction wall part 13*a* is located between the core wire 21 and the voltage detection part 32 and is formed in a rectangular plate shape with the front and rear direction as the longitudinal direction. The first restriction wall part 13*a* comes into contact with the extension part 34 when the voltage detection terminal 30 tries to vibrate in the front and rear direction X with respect to the casing 10. As a consequence, the first restriction wall part 13*a* restricts the voltage detection terminal 30 from moving relative to the front side in the front and rear direction X with respect to the casing 10.

The second restriction wall part 13*b* is formed in a surface facing the voltage detection terminal 30 in the wall part 10*sf*. The second restriction wall part 13*b* is a wall part formed in a groove shape extending along the height direction Z and includes a bottom wall surface 13*ba* and a pair of side wall surfaces 13*bb* and 13*bc*. The bottom wall surface 13*ba* is a wall surface facing the voltage detection terminal 30 in the front and rear direction X and the pair of side wall surfaces 13*bb* and 13*bc* are wall surfaces facing each other in the width direction Y. In the width direction Y, the bottom wall surface 13*ba* is located between the side wall surface 13*bb* and the side wall surface 13*bc*. In the width direction Y, a width between the side wall surface 13*bb* and the side wall surface 13*bc* is set to be slightly wider than that of the extension part 34 in the width direction Y. The extension part 34 of the present embodiment extends through a space surrounded by the groove-shaped second restriction wall part 13*b* in the height direction Z. The pair of side wall surfaces 13*bb* and 13*bc* of the second restriction wall part 13*b* comes into contact with the extension part 34 when the voltage detection terminal 30 tries to vibrate in the width direction Y with respect to the casing 10. As a consequence, the second restriction wall part 13*b* restricts the vibration of the voltage detection terminal 30 in the width direction Y. Furthermore, the bottom wall surface 13*ba* of the second restriction wall part 13*b* comes into contact with the extension part 34 when the voltage detection terminal 30 tries to move rearward relative to the casing 10. As a consequence, the second restriction wall part 13*b* restricts the voltage detection terminal 30 from moving rearward relative to the casing 10.

As described above, the connector 1 according to the present embodiment includes: the casing 10 that has the housing space SP, the through hole 10*hb* communicating the housing space SP with the external space, and the electric wire insertion hole 10*hc*, and that holds the connection terminal 40 connected to the counterpart device; the wiring material W that has the distal end part 20*a* inserted into the housing space SP via the electric wire insertion hole 10*hc*, and the conductor part C exposed from the covering 22 at the distal end part 20*a*, the exposed conductor part C being curved at the curved part 21*aa* and connected to the connection terminal 40; and the conductive voltage detection terminal 30 that has the connection part 31 connected to the exposed conductor part C at a position closer to the covering 22 than the curved part 21*aa* and the voltage detection part 32 facing the through hole 10*hb*, and that is provided by branching from a conduction path R1 between the connection terminal 40 and the conductor part C.

As a comparative example of the present embodiment, there is conceived a configuration in which the voltage detection terminal is provided between a wiring connected to the connection terminal and the core wire and the through hole is formed in a part of the casing, which faces the voltage detection terminal. In such a configuration, for example, a resistance value between the connector and the core wire may increase due to contact resistance between the wiring and the voltage detection terminal, contact resistance between the voltage detection terminal and the core wire, and the like. On the other hand, the connector 1 according to the present embodiment includes the conductive voltage detection terminal 30 having the connection part 31 connected to the exposed core wire 21 at a position closer to the covering 22 than the curved part 21*aa* of the core wire 21 and the voltage detection part 32 facing the through hole 10*hb*. The voltage detection terminal 30 is provided by branching from the conduction path R1 between the connection terminal 40 and the conductor part C. With such a configuration, the voltage detection probe P1 is brought into contact with the voltage detection part 32 from the through hole 10*hb*, so that it is possible to easily confirm the conductive state in the casing 10. Furthermore, since the voltage detection terminal 30 is provided by branching from the conduction path R1 between the connection terminal 40 and the conductor part C, it is possible to provide the voltage detection terminal 30 without increasing the number of connection points between members between the connection terminal 40 and the conductor part C. Consequently, the connector 1 according to the present embodiment has an effect that it is possible to confirm the conductive state in the casing 10 while ensuring appropriate conduction characteristics. For example, it is possible to easily confirm the conductive state in the casing 10 while suppressing an increase in the resistance value between the connection terminal 40 and the core wire 21.

Furthermore, in the voltage detection terminal 30 of the present embodiment, the casing 10 has the through hole 10hb and the voltage detection part 32 faces the through hole 10hb. The voltage detection probe P1 is brought into contact with the voltage detection part 32 from the through hole 10hb, so that it is possible to easily confirm the conductive state in the casing 10.

Furthermore, in the configuration of the comparative example, when the voltage detection terminal is attached to the connection terminal side other than a part corresponding to the curved part 21aa, since load is applied to a contact point between the connection terminal and the terminal of the counterpart connector, an anti-vibration property may deteriorate. In the present embodiment, the connection part 31 is connected to the core wire exposed part 21a at a position closer to the covering 22 than the curved part 21aa, so that it is possible to reduce the load applied to the contact point between the connection terminal 40 and the terminal of the counterpart connector. Consequently, it is possible to improve the anti-vibration performance of the connector 1. Also in this aspect, the connector 1 according to the present embodiment has an effect that it is possible to confirm the conductive state in the casing 10 while ensuring appropriate conduction characteristics.

Furthermore, in the connector 1 according to the present embodiment, the voltage detection terminal 30 has the bending part 33 between the connection part 31 and the voltage detection part 32, the bending part 33 being bent in a direction away from the core wire 21. The voltage detection terminal 30 has the bending part 33, so that, for example, when the connection terminal 40 is connected to the terminal of the counterpart connector, it is possible to ensure a space where the core wire 21 (the core wire exposed part 21a) can be bent rearward. With such a configuration, the bending part 33 can serve as a cross-absorption part that absorbs positional tolerance of the core wire 21 with respect to the voltage detection terminal 30.

Furthermore, in the connector 1 according to the present embodiment, the voltage detection terminal 30 extends along the insertion direction of the wiring material W with respect to the casing 10 and is supported on the conductor part C in a cantilever manner, and the casing 10 has the restriction wall part 13 that restricts the voltage detection terminal 30 from vibrating in a direction intersecting the insertion direction. The restriction wall part 13 restricts the voltage detection terminal 30 from vibrating in the direction intersecting the insertion direction of the covered electric wire 20, so that it is possible to improve the anti-vibration performance of the connector 1.

Furthermore, in the connector 1 according to the present embodiment, the wiring material W is the covered electric wire 20 and the exposed conductor part C is the core wire 21 (the core wire exposed part 21a) of the covered electric wire 20. The connection terminal 40 and the core wire 21 are directly connected to each other, so that it is possible to provide the voltage detection terminal 30 without increasing the number of connection points between members between the connection terminal 40 and the core wire 21.

Second Embodiment

Figure 10:
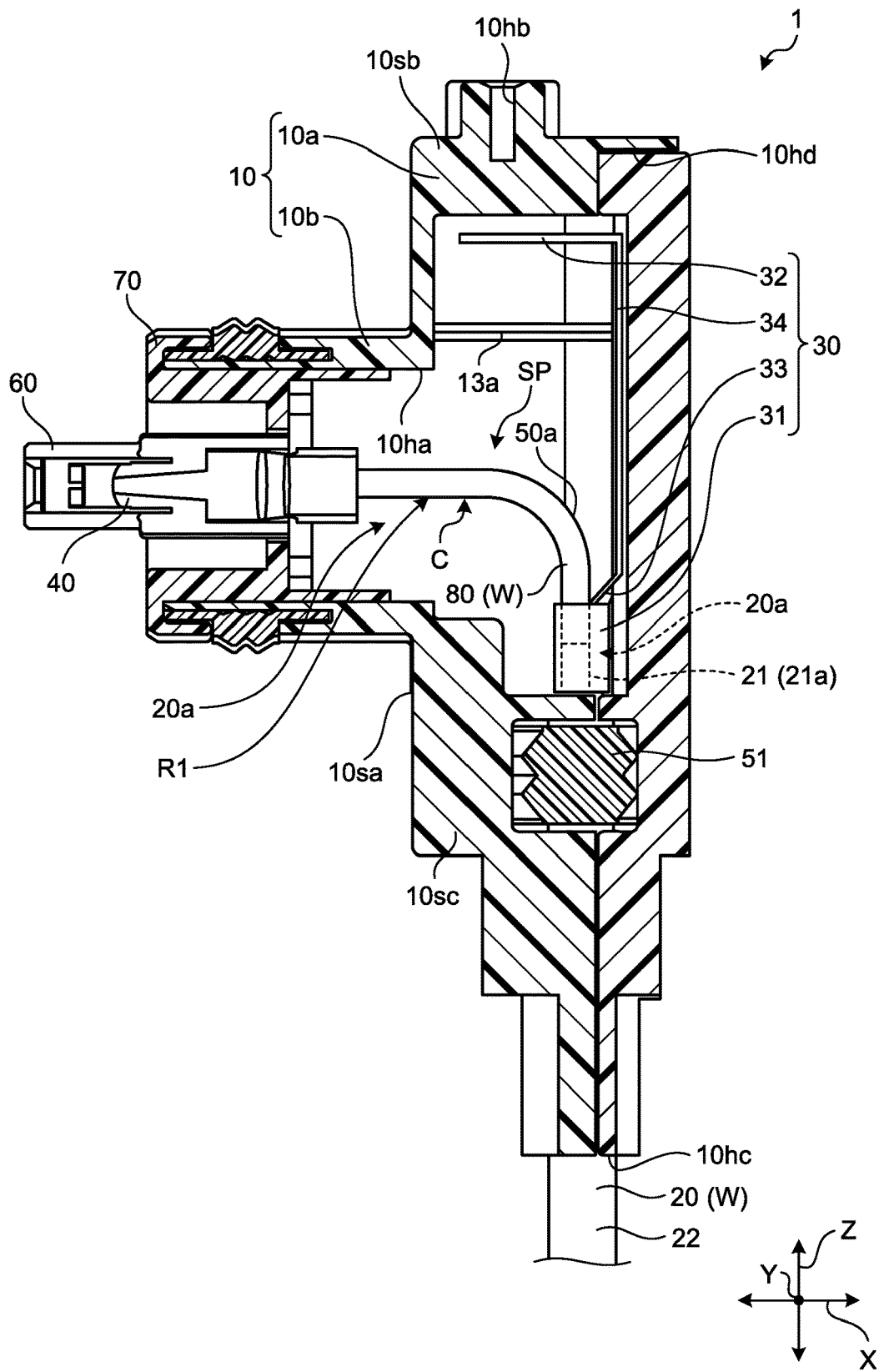
FIG. 10 is a sectional view illustrating a connector according to a second embodiment.

With reference to FIG. 10, a second embodiment will be described. The present embodiment relates to a connector. In the present embodiment, constituent elements having functions similar to those described in the aforementioned first embodiment are denoted by the same reference numerals and a redundant description thereof will be omitted. FIG. 10 is a sectional view illustrating a connector according to the second embodiment. Furthermore, FIG. 10 is a sectional view corresponding to FIG. 3 of the aforementioned first embodiment.

The wiring material W of the present embodiment includes the covered electric wire 20 and a braided body 80. The core wire 21 of the covered electric wire 20 and the braided body 80 constitute a conductor part in the wiring material W. The braided body 80 is the conductor part C exposed from the covering 22 of the covered electric wire 20. As illustrated in FIG. 10, in the connector 1 according to the present embodiment, the braided body 80 having conductivity is provided between the core wire 21 and the connection terminal 40.

The braided body 80 is formed by braiding a braided body composed of a plurality of metal wires into a mesh shape and has flexibility. The braided body 80 of the embodiment has higher flexibility than the core wire 21. The core wire 21 and the connection terminal 40 are electrically connected to each other via the braided body 80. The core wire 21 extends along the insertion direction (height direction Z) of the covered electric wire and one end of the braided body 80 is connected to an end part of the core wire 21. Furthermore, the braided body 80 is connected to the connection terminal 40 by curving a part (curved part 50a) between an end part on the core wire 21 side and an end part on the connection terminal 40 side. In the present embodiment, the voltage detection terminal 30 is connected to the core wire 21 while fixing the core wire 21 exposed by the connection part 31 and the braided body 80. In the conductor part C, the core wire 21 and the braided body 80 directly come into contact with each other. The connection part 31 of the voltage detection terminal 30 is crimped to a contact part between the core wire 21 and the braided body 80. With such a configuration, the core wire 21 and the braided body 80 are fixed in the connected state. Since the core wire 21 and the braided body 80 are directly connected to each other, the voltage detection terminal 30 is provided by branching from the conduction path R1.

As described above, in the connector 1 according to the present embodiment, the wiring material W includes the covered electric wire 20 and the braided body 80, the exposed conductor part C is the braided body 80 connected to the core wire of the covered electric wire 20, and the connection part 31 fixes the core wire 21 and the braided body 80.

In the connector 1 according to the present embodiment, the core wire 21 and the connection terminal 40 are connected to each other by the braided body 80. By using the braided body 80 having higher flexibility than that of the core wire 21, the covered electric wire 20 can be easily attached to the casing 10. In addition, the connector 1 can easily perform voltage detection via the voltage detection terminal 30 connected so as to branch from the braided body 80 constituting the conductor part C of the wiring material W. Consequently, the connector 1 according to the present embodiment can achieve a good balance between ease of attachment to the casing and appropriate conduction characteristics. In addition, it is possible to confirm the conductive state in the casing 10.

Furthermore, similarly to the aforementioned first embodiment, the voltage detection probe P1 is brought into contact with the voltage detection part 32 from the through hole 10hb, so that it is possible to easily confirm the conductive state in the casing 10.

In addition, the connector according to each of the aforementioned embodiments of the present invention is not limited to each of the aforementioned embodiments and various modifications can be made within the scope of the claims.

For example, in the aforementioned first embodiment, the configuration in which the voltage detection terminal 30 includes the bending part 33 and the extension part 34 between the connection part 31 and the voltage detection part 32 has been described as an example. However, the configuration of the voltage detection terminal 30 is not limited thereto. For example, in the voltage detection terminal 30, the connection part 31 and the voltage detection part 32 may also be connected to each other only via the extension part 34. That is, the voltage detection terminal 30 may not be provided with the bending part 33.

Furthermore, in the aforementioned first embodiment, the configuration in which the casing 10 has the restriction wall part 13 has been described as an example. However, the configuration of the casing 10 is not limited thereto. For example, the casing 10 may not have the restriction wall part 13.

The contents disclosed in the aforementioned embodiments and modification example can be implemented by an appropriate combination.

The connector according to the present embodiments include the conductive voltage detection terminal having the connection part connected to the exposed conductor part at a position closer to the covering than the curved part of the conductor part and the voltage detection part facing the through hole. Furthermore, the voltage detection terminal is provided by branching from the conduction path between the connection terminal and the conductor part. With such a configuration, the connector according to the present embodiments have an effect that it is possible to easily confirm a conductive state in the casing while ensuring appropriate conduction characteristics.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A connector comprising:
a casing that has a housing space, a through hole communicating the housing space with an external space, and an electric wire insertion hole, and that holds a connection terminal connected to a counterpart device;
a wiring material that has a distal end part inserted into the housing space via the electric wire insertion hole and a conductor part exposed from a covering at the distal end part, the exposed conductor part being curved at a curved part and connected to the connection terminal; and
a conductive voltage detection terminal that has a connection part connected to the exposed conductor part at a position closer to the covering than the curved part and a voltage detection part facing the through hole, and that is provided by branching from a conduction path between the connection terminal and the conductor part.

2. The connector according to claim 1, wherein
the voltage detection terminal has a bending part between the connection part and the voltage detection part, the bending part being bent in a direction away from the conductor part.

3. The connector according to claim 2, wherein
the voltage detection terminal extends along an insertion direction of the wiring material with respect to the casing and is supported on the conductor part in a cantilever manner, and
the casing has a restriction wall part that restricts the voltage detection terminal from vibrating in a direction intersecting the insertion direction.

4. The connector according to claim 3, wherein
the wiring material includes a covered electric wire including a core wire covered by a covering, and
the exposed conductor part is the core wire of the covered electric wire.

5. The connector according to claim 3, wherein
the wiring material includes a covered electric wire including a core wire covered by a covering, and a braided body connected to the core wire,
the exposed conductor part is the braided body, and
the connection part fixes the core wire and the braided body.

6. The connector according to claim 2, wherein
the wiring material includes a covered electric wire including a core wire covered by a covering, and
the exposed conductor part is the core wire of the covered electric wire.

7. The connector according to claim 2, wherein
the wiring material includes a covered electric wire including a core wire covered by a covering, and a braided body connected to the core wire,
the exposed conductor part is the braided body, and
the connection part fixes the core wire and the braided body.

8. The connector according to claim 1, wherein
the voltage detection terminal extends along an insertion direction of the wiring material with respect to the casing and is supported on the conductor part in a cantilever manner, and
the casing has a restriction wall part that restricts the voltage detection terminal from vibrating in a direction intersecting the insertion direction.

9. The connector according to claim 8, wherein
the wiring material includes a covered electric wire including a core wire covered by a covering, and
the exposed conductor part is the core wire of the covered electric wire.

10. The connector according to claim 8, wherein
the wiring material includes a covered electric wire including a core wire covered by a covering, and a braided body connected to the core wire,
the exposed conductor part is the braided body, and
the connection part fixes the core wire and the braided body.

11. The connector according to claim 1, wherein
the wiring material includes a covered electric wire including a core wire covered by a covering, and
the exposed conductor part is the core wire of the covered electric wire.

12. The connector according to claim 1, wherein
the wiring material includes a covered electric wire including a core wire covered by a covering, and a braided body connected to the core wire,
the exposed conductor part is the braided body, and
the connection part fixes the core wire and the braided body.

* * * * *